United States Patent
Miyaki

(10) Patent No.: US 9,709,632 B2
(45) Date of Patent: Jul. 18, 2017

(54) METHOD OF ESTIMATING BATTERY LIFE, BATTERY LIFE ESTIMATION DEVICE, ELECTRIC VEHICLE, AND ELECTRIC POWER SUPPLY APPARATUS

(71) Applicant: Sony Corporation, Tokyo (JP)

(72) Inventor: Yukio Miyaki, Fukushima (JP)

(73) Assignee: Sony Corporation, Tokyo (JP)

( * ) Notice: Subject to any disclaimer, the term of this patent is extended or adjusted under 35 U.S.C. 154(b) by 582 days.

(21) Appl. No.: 14/048,975

(22) Filed: Oct. 8, 2013

(65) Prior Publication Data

US 2014/0107956 A1 Apr. 17, 2014

(30) Foreign Application Priority Data

Oct. 15, 2012 (JP) .................. 2012-228122

(51) Int. Cl.
  *G01R 31/36* (2006.01)
  *B60L 3/12* (2006.01)
  *B60L 11/18* (2006.01)

(52) U.S. Cl.
  CPC ............... *G01R 31/36* (2013.01); *B60L 3/12* (2013.01); *B60L 11/1857* (2013.01); *B60L 11/1861* (2013.01); *G01R 31/3679* (2013.01); *B60L 2240/545* (2013.01); *B60L 2240/547* (2013.01); *B60L 2240/549* (2013.01); *B60L 2260/44* (2013.01); *G01R 31/3651* (2013.01); *Y02T 10/705* (2013.01); *Y02T 10/7011* (2013.01); *Y02T 10/7044* (2013.01)

(58) Field of Classification Search
  USPC .......................................... 702/63
  See application file for complete search history.

(56) References Cited

U.S. PATENT DOCUMENTS

2007/0152640 A1* 7/2007 Sasaki ............... B60H 1/00278
                                              320/150

OTHER PUBLICATIONS

Eric Wood, Battery End-of-Life Considerations for Plug-in Hybrid Electric Ehicles, Colorado State University, Fort Collins, Colorado, Fall 2011, p. i-50, total 59 pages.*
Vincenzo Marano, Lithium-ion Batteries Life Estimation for Plug-in Hybrid Electric Vehicles, © 2009 IEEE, p. 536-543.*
Vincenzo Marano, Lithium-ion Batteries Life Estimation for Plug-in Hybrid Electric Vehicles, © 2009 IEEE, pp. 536-543.*

* cited by examiner

*Primary Examiner* — Tung Lau
(74) *Attorney, Agent, or Firm* — Chip Law Group

(57) ABSTRACT

A method of estimating a battery life includes: for a secondary battery having a degradation rate R when X days have elapsed after initial charge of the secondary battery, calculating a degradation estimation value (X+Y) days after the initial charge from degradation master data, the degradation master data being identified with use of conditions of temperature T provided for the calculation and a battery state S provided for the calculation; and deriving number of elapsed days Xcorr giving the degradation rate R based on the identified degradation master data, and calculating the degradation estimation value (Xcorr+Y) days after the initial charge from the identified degradation master data.

13 Claims, 8 Drawing Sheets

METHOD OF ESTIMATING BATTERY LIFE, BATTERY LIFE ESTIMATION DEVICE, ELECTRIC VEHICLE, AND ELECTRIC POWER SUPPLY APPARATUS

CROSS REFERENCE TO RELATED APPLICATIONS

This application claims the benefit of Japanese Priority Patent Application JP 2012-228122 filed Oct. 15, 2012, the entire contents of which are incorporated herein by reference.

BACKGROUND

The present disclosure relates to a method of estimating a life, for example, of a lithium ion secondary battery or the like, to a life estimation device, for example, for a lithium ion secondary battery or the like, to an electric vehicle, and to an electric power supply apparatus.

As an electric power source in a power field including, for example, an electric vehicle, a hybrid vehicle, an electric motorcycle, and an electric power-assisted bicycle or in an electric storage field including, for example, load leveling, peak shift, and backup, a lithium ion secondary battery has been widely used.

In using the secondary battery in the power field or the electric storage field, it is largely necessary to accurately estimate a life of the secondary battery. One reason for this is that, in the case where a battery life is wrongly estimated longer than actual life and the battery life expires while in use of an apparatus, it may lead to a severe damage or a severe accident. Another reason for this is that, in contrast, in the case where the battery life is estimated excessively short, the battery is renewed unnecessarily. Further, since a battery is built into a large-scale system as part thereof, it is not necessarily possible to renew an old battery anytime. In such a system, it is necessary to renew the old battery according to a plan while previously considering a usage state and the like based on an estimated battery life. From the foregoing points, an accurate method of estimating a life of a battery has been strongly desired.

For example, in Japanese Unexamined Patent Application Publication No. 2007-322171 (JP2007-322171A), a technology to calculate degradation level and a remaining capacity of an automotive battery is disclosed. Further, it has been known that a full-charge capacity is estimated from variation in internal resistance of a battery and voltage drop of the battery.

SUMMARY

If a technology of estimating capacity degradation is available, frequency shortage of measurement evaluations is allowed to be compensated, and a battery life is allowed to be determined with sufficient time. It has been regarded that determination of a remaining life of a lithium ion secondary battery is difficult. Therefore, single condition varying with time, that is, only a cycle life or only a preservation life has been measured and estimated. Such a method is not a practical method. One reason for this is that an actual secondary battery is used both in a state of cycles and in a state of preservation. Therefore, it has been desired to achieve an estimation method suitable for practical use that is allowed to deal with a mixed state of various conditions varying with time. The technology disclosed in JP2007-322171A and existing life estimation methods are used for obtaining degradation at present, and are not sufficient in terms of estimating degradation degrees in the future.

It is desirable to provide a method of estimating a life, a life estimation device, an electric vehicle, and an electric power supply apparatus that are capable of accurately estimating a life of a secondary battery.

According to an embodiment of the present technology, there is provided a method of estimating a battery life, the method including:

for a secondary battery having a degradation rate R when X days have elapsed after initial charge of the secondary battery, calculating a degradation estimation value (X+Y) days after the initial charge from degradation master data, the degradation master data being identified with use of conditions of temperature T provided for the calculation and a battery state S provided for the calculation; and deriving number of elapsed days Xcorr giving the degradation rate R based on the identified degradation master data, and calculating the degradation estimation value (Xcorr+Y) days after the initial charge from the identified degradation master data.

According to an embodiment of the present technology, there is provided a battery life estimation device including:

a storage section configured to store a plurality of types of degradation master data;

a condition setting section configured to set conditions related to temperature T provided for calculation and a battery state S provided for the calculation; and a controller configured to obtain a degradation estimation value, wherein for a secondary battery having a degradation rate R when X days have elapsed after initial charge of the secondary battery, the battery life estimation device is configured to calculate the degradation estimation value (X+Y) days after the initial charge from the degradation master data, the controller is configured to select one of the plurality of types of degradation master data with use of the conditions set by the condition setting section, and the controller is configured to derive number of elapsed days Xcorr giving the degradation rate R based on the identified degradation master data, and to calculate the degradation estimation value (Xcorr+Y) days after the initial charge from the identified degradation master data.

According to an embodiment of the present technology, there is provided an electric vehicle including a battery life estimation device including a storage section configured to store a plurality of types of degradation master data, a condition setting section configured to set conditions related to temperature T provided for calculation and a battery state S provided for the calculation, and a controller configured to obtain a degradation estimation value, wherein for a secondary battery having a degradation rate R when X days have elapsed after initial charge of the secondary battery, the battery life estimation device is configured to calculate the degradation estimation value (X+Y) days after the initial charge from the degradation master data, the secondary battery being configured to generate drive power of the vehicle, the controller is configured to select one of the plurality of types of degradation master data with use of the conditions set by the condition setting section, and the controller is configured to derive number of elapsed days Xcorr giving the degradation rate R based on the identified degradation master data, and to calculate the degradation estimation value (Xcorr+Y) days after the initial charge from the identified degradation master data.

According to an embodiment of the present technology, there is provided an electric power supply apparatus including
a battery life estimation device including
a storage section configured to store a plurality of types of degradation master data,
a condition setting section configured to set conditions related to temperature T provided for calculation and a battery state S provided for the calculation, and
a controller configured to obtain a degradation estimation value, wherein
for a secondary battery having a degradation rate R when X days have elapsed after initial charge of the secondary battery, the battery life estimation device is configured to calculate the degradation estimation value (X+Y) days after the initial charge from the degradation master data, the secondary battery being configured to generate alternating electric power,
the controller is configured to select one of the plurality of types of degradation master data with use of the conditions set by the condition setting section, and
the controller is configured to derive number of elapsed days Xcorr giving the degradation rate R based on the identified degradation master data, and to calculate the degradation estimation value (Xcorr+Y) days after the initial charge from the identified degradation master data.

By the method of estimating a battery life according to the embodiment of the present disclosure, even in a state in which conditions such as charge and discharge cycles, preservation, and various environmental temperatures are varied, a life is estimated with little error.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
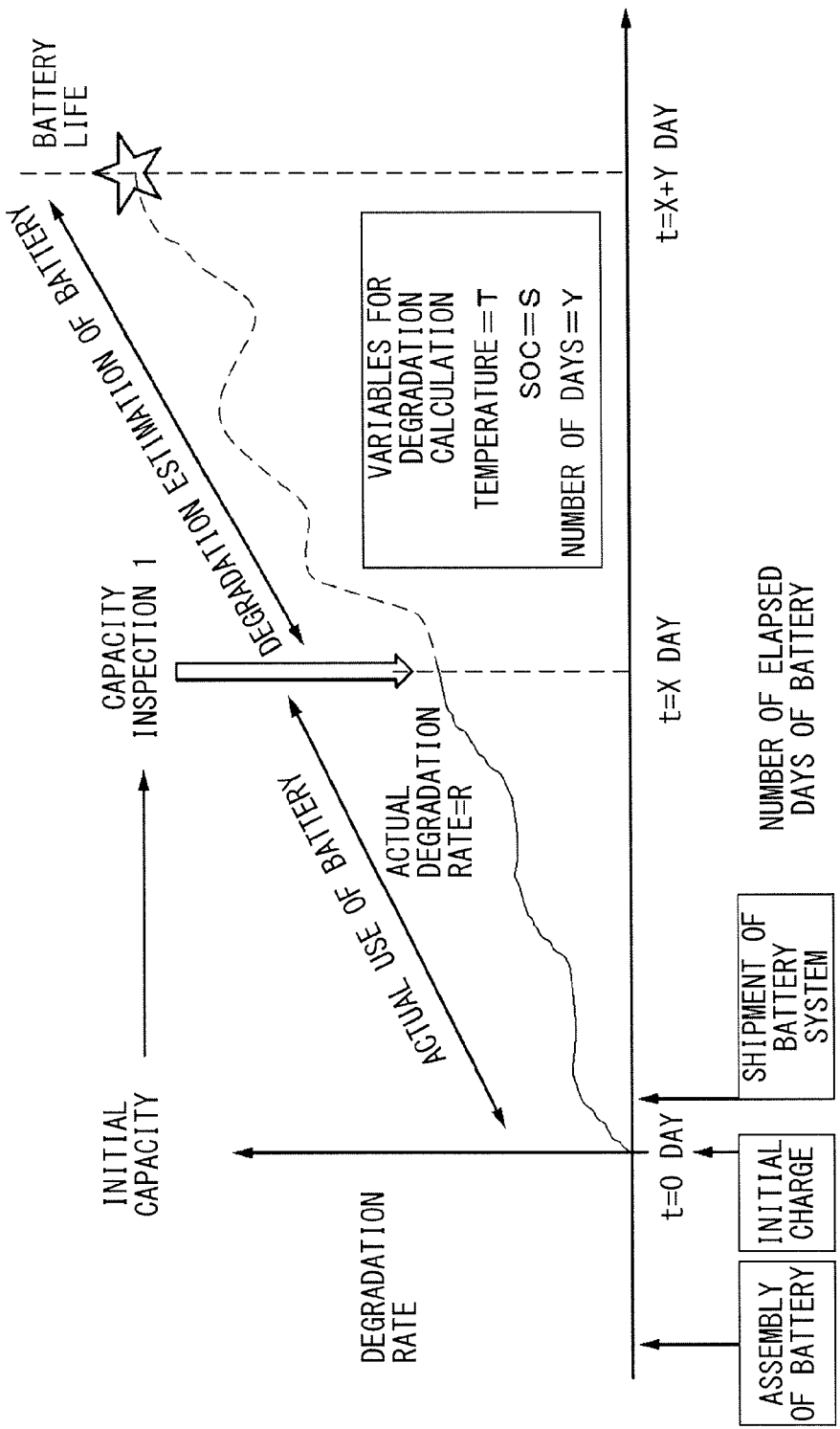
FIG. 1 is a schematic diagram used for explanation of a method of estimating a life of a battery.

Embodiments described below are some preferred specific examples of the present disclosure. In the embodiments, various limitations that may be technically preferable are given. However, in the following description, the scope of the present disclosure is not limited to these embodiments unless a description to limit thereto is given.

[Example of Lithium Ion Secondary Battery]

In an embodiment of the present disclosure, one example of batteries used therein may be a lithium ion secondary battery containing a cathode active material and graphite as an anode active material. Although a cathode material is not particularly limited, the cathode material may preferably contain a cathode active material having an olivine structure. More preferable examples of the cathode active material having an olivine structure may include a lithium iron phosphate compound ($LiFePO_4$) and a lithium iron complex phosphate compound ($LiFe_xM_{1-x}O_4$: M represents one or more types of metal, and x is in the range of 0<x<1) containing a different atom. Further, in the case where M represents two or more types of metal, selection is made so that the total of inferior numbers of the respective types of metal becomes 1-x. Examples of M may include transition elements, group IIA elements, group IIIA elements, group IIIB elements, and group IVB elements. In particular, one or more of cobalt (Co), nickel, manganese (Mn), iron, aluminum, vanadium (V), and titanium (Ti) may be preferably included therein.

In the cathode active material, a coating layer containing a metal oxide (such as a metal oxide configured of an element selected from a group including Ni, Mn, Li, and the like) having a composition different from that of the lithium iron phosphate compound or the lithium iron complex phosphate compound, a phosphate compound (such as lithium phosphate), and/or the like may be provided on the surface of the lithium iron phosphate compound or the lithium iron complex phosphate compound.

The graphite in the embodiment of the present disclosure is not particularly limited. As the graphite, a graphite material used in the industry may be widely used.

A method of manufacturing an electrode of the battery according to the embodiment of the present disclosure is not particularly limited. As the method, a method used in the industry may be widely used.

A configuration of the battery in the embodiment of the present disclosure is not particularly limited. As the configuration of the battery, a known configuration may be widely used.

An electrolytic solution used for the embodiment of the present disclosure is not particularly limited, and examples thereof may include a liquid electrolytic solution and a gel electrolytic solution. As the electrolytic solution, an electrolytic solution that is used in the industry may be widely used.

Preferable examples of a solvent of the electrolytic solution may include 4-fluoro-1,3-dioxolane-2-one (FEC), ethylene carbonate, propylene carbonate, butylene carbonate, vinylene carbonate (VC), dimethyl carbonate, diethyl carbonate, ethyl methyl carbonate, γ-butyrolactone, γ-valerolactone, 1,2-dimethoxyethane, tetrahydrofuran, 2-methyltetrahydrofuran, 1,3-dioxolane, 4-methyl-1,3-dioxolane, methyl acetate, methyl propionate, ethyl propionate, acetonitrile, glutaronitrile, adiponitrile, methoxyacetonitrile, 3-methoxypropionitrile, N,N-dimethylformamide, N-methylpyrrolidinone, N-methyloxazolidinone, nitromethane, nitroethane, sulfolane, dimethyl sulfoxide, trimethyl phosphate, triethyl phosphate, ethylene sulfide, and bisrifluoromethyl sulfonyl imide trimethyl hexyl ammonium. More preferable examples thereof may include 4-fluoro-1,3-dioxolane-2-one (FEC), ethylene carbonate, propylene carbonate, butylene carbonate, vinylene carbonate (VC), dimethyl carbonate, diethyl carbonate, ethyl methyl carbonate, γ-butyrolactone, and γ-valerolactone.

Preferable examples of a support salt of the electrolytic solution may include lithium hexafluorophosphate ($LiPF_6$), bis(pentafluoroethanesulfonyl)imide lithium ($Li(C_2F_5SO_2)_2N$), lithium perchlorate ($LiClO_4$), lithium hexafluoroarsenate ($LiAsF_6$), lithium tetrafluoroborate ($LiBF_4$), lithium trifluoromethane sulfonate ($LiSO_3CF_3$), bis(trifluoroethanesulfonyl)imide lithium ($Li(CF_3SO_2)_2N$), and tris(trifluoroethanesulfonyl)methyl lithium ($LiC(SO_2CF_3)_3$).

[Outline of Degradation Estimation]

A description will be given of outline of degradation estimation referring to FIG. 1. FIG. 1 illustrates a relation between time course and degradation rate. At the time of assembling the battery, battery electrodes and the electrolytic solution are enclosed and sealed in an outer package member. Next, the first charge (referred to as the initial charge) at the rate of 50% or more of a rated capacity of the battery is performed. A capacity in an unused state is expressed by initial capacity Capa (0), and a capacity X days after the initial charge is expressed by Capa (x). Degradation rate R measured t days after the initial charge is expressed as follows.

$$R=100-100\times Capa(x)/Capa(0) \quad (0\le R\le 100)$$

It is to be noted that a capacity retention rate is determined by 100-(capacity degradation rate).

In the embodiment of the present disclosure, after measuring the capacity on date X, capacity degradation rate is estimated for Y days ($0 \le X, Y$). "X" as the reference date for life estimation is not particularly limited, and may correspond to a date such as a routine inspection date of the battery that is previously set. That is, "X" may be selected from within the life range of the battery. For example, in the case where a routine inspection date of a vehicle is the date X, and the next routine inspection date of the vehicle is set to a date Y days after the date X, whether or not performance of the battery is secured until the next routine inspection of the vehicle is allowed to be estimated.

Y is a value representing how many days after the date X as the reference date for life estimation the capacity degradation is to be estimated. Y may be arbitrarily selected according to the purpose of estimation. Upon estimating the degradation Y days after, as conditions, temperature (=T), SOC (State of Charge) (=S), and the number of days (=Y) are designated to calculate an estimated value. It is to be noted that, instead of SOC, DOD (Depth of Discharge) may be used. SOC and DOD are collectively referred to as "battery state".

In the embodiment of the present disclosure, as conditions in the estimation time period (Y days), a plurality of conditions (Z1, Z2, . . . , Zn) are allowed to be used. A description will be given below of a buildup method of degradation when the condition transition is performed from Zn−1 to Zn. The embodiment of the present disclosure may be characterized in the buildup method of degradation.

The foregoing cathode active material having an olivine structure has extremely superior chemical stability. That is, degradation with time due to the cathode is negligibly small, and cell capacity loss is determined by a loss amount of lithium due to a side reaction on the surface of the anode graphite. Therefore, in the case where a cell degraded to the capacity degradation rate R % is further used continuously under another conditions, a loss amount of lithium corresponding to the degradation rate R % may be taken over at the time of start of the next use thereof. As a result, buildup calculation of the degradation rate in the case of switching conditions is allowed to be performed.

Figure 2:
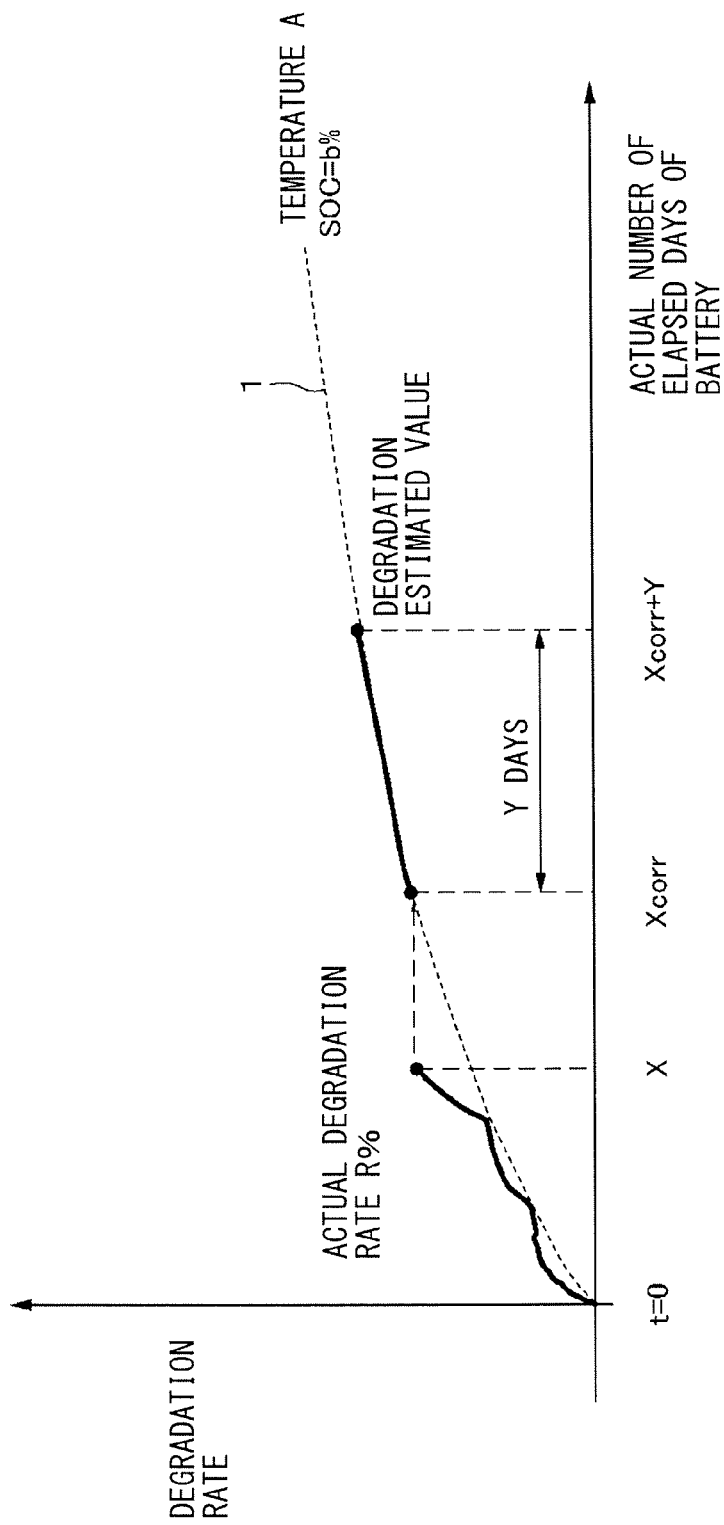
FIG. 2 is a schematic diagram used for explanation of a method of estimating a life according to an embodiment of the present disclosure.

As an example, a degradation estimation value is obtained where degradation rate after actual use for X days is R %, and in a case that conditions are set so that time period is Y, the temperature T is A deg C, and SOC(S) is b %. In FIG. 2, a dashed curve 1 is a degradation master curve corresponding to new conditions (T=A deg C, S=b %) in the case of performing degradation estimation. The degradation master curve is previously obtained by a mathematical expression, and is stored in a nonvolatile memory as a table. Referring to the table, the degradation estimation value is obtainable. Alternatively, the degradation estimation value is obtainable by a mathematical expression (program). By designating conditions, a corresponding degradation master curve is determined In the degradation master curve 1 under the new conditions for performing degradation estimation, by performing new degradation estimation with time for Y days from a point (point of date Xcorr) corresponding to the degradation rate R %, the degradation estimation value Y days after is obtained. That is, in the embodiment of the present disclosure, the actual degradation rate R (%) is shifted in parallel with the horizontal axis (the actual number of elapsed days of the battery), and the crossing point between the shifted location and the degradation master curve 1 is regarded as the number of days Xcorr. As described above, the date when switching is made to the new conditions is not the date X, and is converted to a new day, that is, the date Xcorr.

As a method different from that of the embodiment of the present disclosure, a simple buildup method of degradation rate can be mentioned. For example, capacity degradation rate in the case where a battery is preserved at 45 deg C. and at the rate of SOC of 100% for one month from the initial charge is as assumed to be 5%.

Further, capacity degradation rate in the case where the battery is preserved at 60 deg C. and at the rate of SOC of 100% for one month from the initial charge is as assumed to be 10%.

Capacity degradation rate is obtained in the case where one month has elapsed from the initial charge under the condition of 45 deg C., and continuously, one month has elapsed under the condition of 60 deg C. One of the methods thereof is a method of multiplying one degradation rate by the other degradation rate. That is, $(1-0.05)\times(1-0.1)=0.855$ is obtained. In this method, degradation is obtained as 14.5%. In such a method, in the variation with time, initial time period with large degradation is redundantly counted, and therefore, degradation is evaluated excessively large.

Further, a method of adding degradation rates (5+10=15%, degradation: 0.85%) also leads to estimation with severe inaccuracy.

The degradation master curve is a variation curve of battery capacity degradation rate with respect to time in the case where a battery is preserved (or cycled) at constant temperature and constant SOC (or DOD). The degradation master curve may be obtained by actual degradation data of the battery. However, various data is necessary, and time period of data collection with time may be long, for example, for about 10 years. Therefore, it is not practical to construct the degradation master curve only by measured data.

The degradation master data in the embodiment of the present disclosure may be preferably values obtained by calculation based on a mathematical expression. More preferably, the degradation master data in the embodiment of the present disclosure may be a value calculated based on product of a value calculated from temperature of an outer wall of a battery, a value calculated from the number of days which have elapsed after the initial charge of the battery, and a value calculated from a battery state such as SOC.

Further, more preferable example may be as follows. The value calculated from the temperature T of the outer wall of the battery may be calculated using an expression including $\exp(-A/T)$ (T is absolute temperature). The value calculated from the number of days which have elapsed after the initial charge of the battery may be calculated from an expression including (the number of days which have elapsed)$^B$ ("^" represents power) (where $0.3<B<0.7$ holds). The value calculated from the state of charge SOC of the battery may be calculated using an expression including $\exp(C \times SOC/T)$. A, B, and C may be preferably obtained by fitting of the data of the battery measured with time. C represents dependence of degradation on time. C is from 0.1 to 1.5 both inclusive, and may be preferably from 0.35 to 0.65 both inclusive.

In the expression of the degradation master curve in the embodiment of the present disclosure, the temperature T does not refer to ambient temperature at which a battery cell is located, but refers to temperature of the outer surface of the battery cell. In the expression of the degradation master curve in the embodiment of the present disclosure, in the case where a battery is preserved, the SOC itself of the battery during preservation may be used. In contrast, in the case where SOC is varied with time when, for example, a battery is in cycle, a time average value in the range of SOC is allowed to be used. It is to be noted that the number of cycles in the number of days which have elapsed has no relation with estimation of a life, as long as the time average value of SOC is the same.

In the case where degradation is not linearly varied with respect to SOC, a weighted average may be more preferably obtained for each SOC point. For example, considering that a measured degradation value or capacity degradation is caused by a reduction side reaction on the anode graphite, each degradation speed ratio for each SOC may be obtained by the following expression, and each SOC variation point is allowed to be weighted by each of the degradation speed ratios.

Each degradation speed ratio for each SOC may be obtained with the use of specific degradation speed=$\exp(\alpha F \eta / RT)$ where $\eta$ represents (1-(anode graphite electric potential to Li)), $\alpha=0.5$, $R=8.314$, $F=96485$, and T represents battery temperature (K°). Each SOC variation point may be weighted by such each degradation speed ratio.

[Example of Degradation Estimation]

Figure 3:
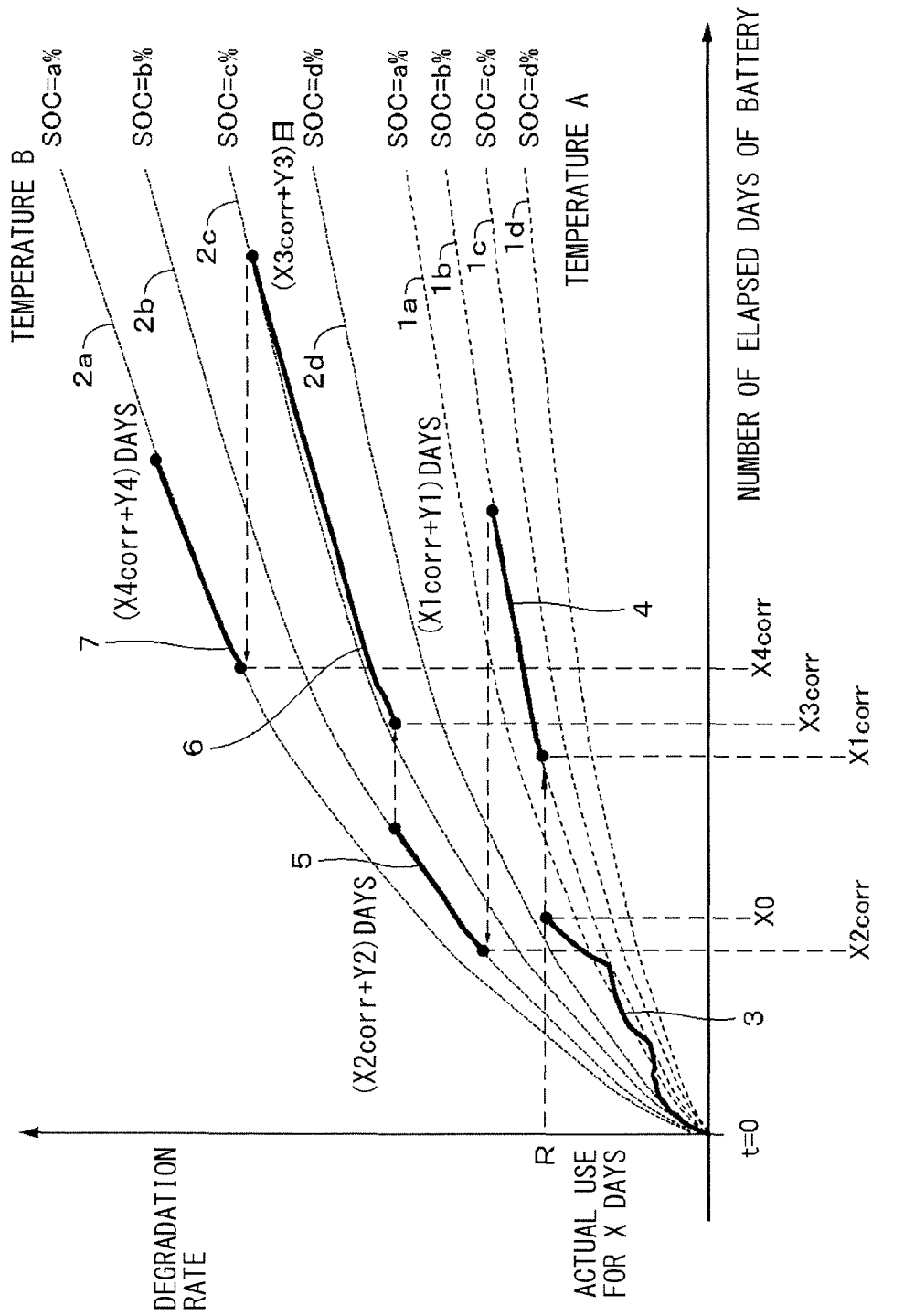
FIG. 3 is a schematic diagram used for explanation of the method of estimating a life according to the embodiment of the present disclosure in the case where a plurality of conditions are varied.

A description will be given of an example of degradation estimation referring to FIG. 3. FIG. 3 illustrates degradation master curves 1a, 1b, 1c, and 1d and degradation master curves 2a, 2b, 2c, and 2d. The degradation master curves 1a to 1d are degradation master curves in the case where the temperature T is A, and correspond to cases where SOC are a %, b %, c %, and d %, respectively. The degradation master curves 2a to 2d are degradation master curves in the case where the temperature T is B, and correspond to cases where SOC are a %, b %, c %, and d %, respectively.

In FIG. 3, thick lines indicate transition of variation in degradation rate as descried below.

The initial charge is performed at the time of t=0. As indicated by curve 3, a battery is actually used until the time of t=X0 when an actual capacity of the battery is measured. The actual degradation rate R % is obtained.

Next, setting is made so that Y1 days are to elapse under conditions that temperature is A, and SOC is b %. The setting is made by a user. Correspondingly to such conditions, the degradation master curve 1b is selected. As described above, in the case where the battery degraded to the capacity degradation rate R % is further used continuously under another condition, a loss amount of lithium corresponding to the degradation rate R % may be taken over at the time of start of the next use thereof. Therefore, the actual degradation rate R (%) is shifted in parallel with the horizontal axis (the actual number of elapsed days of the battery), and the crossing point between the shifted location and the degradation master curve 1b is the date X1corr, which is regarded as the switching date to the new conditions. During the time period from X1corr to a date Y1 days after X1corr, degradation rate is predicted to be varied as indicated by thick line 4 on the degradation master curve 1b. The number of charges and discharges during the time period of the Y1 days may be arbitrary. The same may be applied to other preservation time period.

Next, setting is made so that Y2 days are to elapse under conditions that temperature is B, and SOC is b %. Correspondingly to such conditions, the degradation master curve 2b is selected. A degradation estimation value at the end of the thick line 4 is shifted in parallel with the horizontal axis (the actual number of elapsed days of the battery), and the crossing point between the shifted location and the degradation master curve 2b is date X2corr, which is regarded as the switching date to the new conditions. During the time period from X2corr to the date Y2 days after X2corr, degradation rate is predicted to be varied as indicated by thick line 5 on the degradation master curve 2b.

Next, setting is made so that Y3 days are to elapse under conditions that temperature is B, and SOC is c %. Correspondingly to such conditions, the degradation master curve 2c is selected. A degradation estimation value at the end of the thick line 5 is shifted in parallel with the horizontal axis (the actual number of elapsed days of the battery), and the crossing point between the shifted location and the degradation master curve 2c is date X3corr, which is regarded as the switching date to the new conditions. During the time period from X3corr to the date Y3 days after X3corr, degradation rate is predicted to be varied as indicated by thick line 6 on the degradation master curve 2c.

Next, setting is made so that Y4 days are to elapse under conditions that temperature is B, and SOC is a %). Correspondingly to such conditions, the degradation master curve 2a is selected. A degradation estimation value at the end of the thick line 6 is shifted in parallel with the horizontal axis (the actual number of elapsed days of the battery), and the crossing point between the shifted location and the degradation master curve 2a is date X4corr, which is regarded as the switching date to the new conditions. During the time period from X4corr to the date Y4 days after X4corr, degradation rate is predicted to be varied as indicated by thick line 7 on the degradation master curve 2a.

As a result of the foregoing process, a degradation estimation value of the battery at the time when (Y1+Y2+Y3+

Y4) days have elapsed after the time point of X0 is obtained. For example, in the case of a battery mounted on an electric vehicle, degradation rate of the battery at the time of the next vehicle inspection is allowed to be estimated where X0 is time point of the present vehicle inspection, and the time point after the (Y1+Y2+Y3+Y4) days have elapsed is a scheduled date of the next vehicle inspection. The foregoing transition of the conditions is merely an example, and various transitions are possible. However, in consideration of actual conditions such as types of electric storage devices (an electric vehicle, a hybrid vehicle, an electric power storage device in a house, and the like), usage purposes of batteries (professional use, household use, and the like), and usage areas (a cold area, a warm area, and the like), transition of conditions according to a practical case is allowed to be set to some degrees. For example, a manufacturer such as an automotive company may provide information on the foregoing transition of conditions.

[Example of Degradation Estimation Device]

Figure 4:
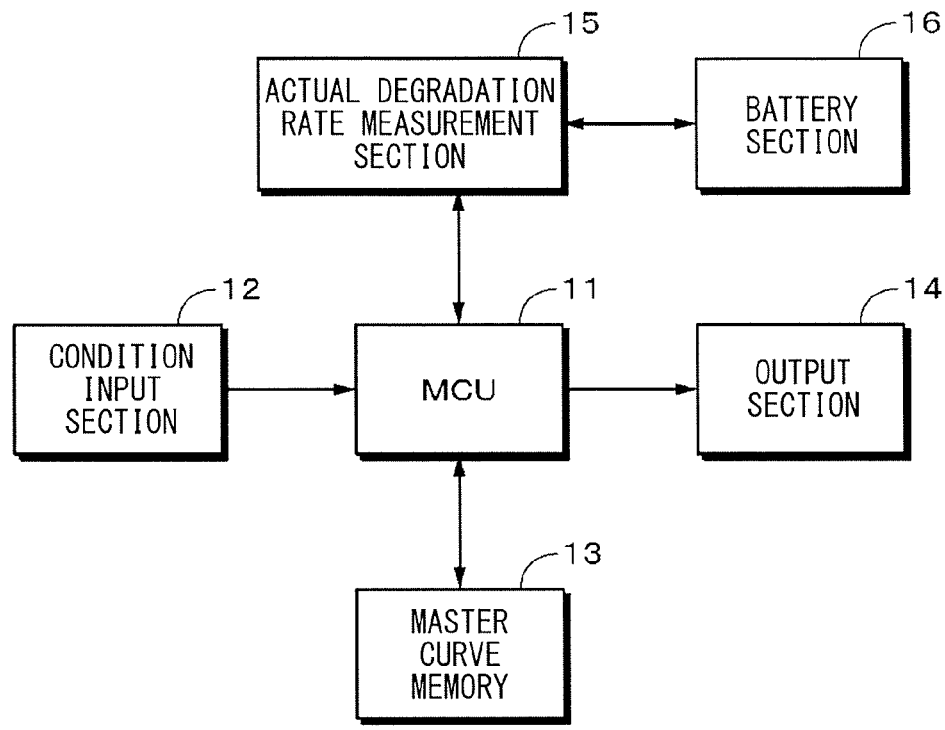
FIG. 4 is a block diagram schematically illustrating a life estimation device according to an embodiment of the present disclosure.

FIG. 4 illustrates outline of a degradation estimation device to which the embodiment of the present disclosure is applied. In FIG. 4, information on transition of conditions is inputted from a condition input section 12 to a microcontroller unit (noted as MCU in FIG. 4) 11. As described above, the conditions (temperature, SOC, and elapsed days) are inputted. In general, a plurality of conditions are inputted in order.

Degradation master curve data is inputted from a master curve memory (nonvolatile memory) 13 to the microcontroller unit 11. As described above, the degradation master curve data is data obtained by performing fitting of data of a battery measured with time on data obtained by a mathematical expression, obtaining each degradation speed ratio for each SOC, and performing weighting on each SOC variation point by each of the degradation speed ratios. The degradation master curve data is previously stored.

Further, measured actual degradation rate data is supplied from an actual degradation rate measurement section 15 to the microcontroller unit 11. The actual degradation rate measurement section 15 measures degradation rate at present of a battery section 16. An output section 14 is connected to the microcontroller unit 11. A degradation estimation value in set conditions may be displayed and the degradation estimation value may be printed by the output section 14.

Figure 5:
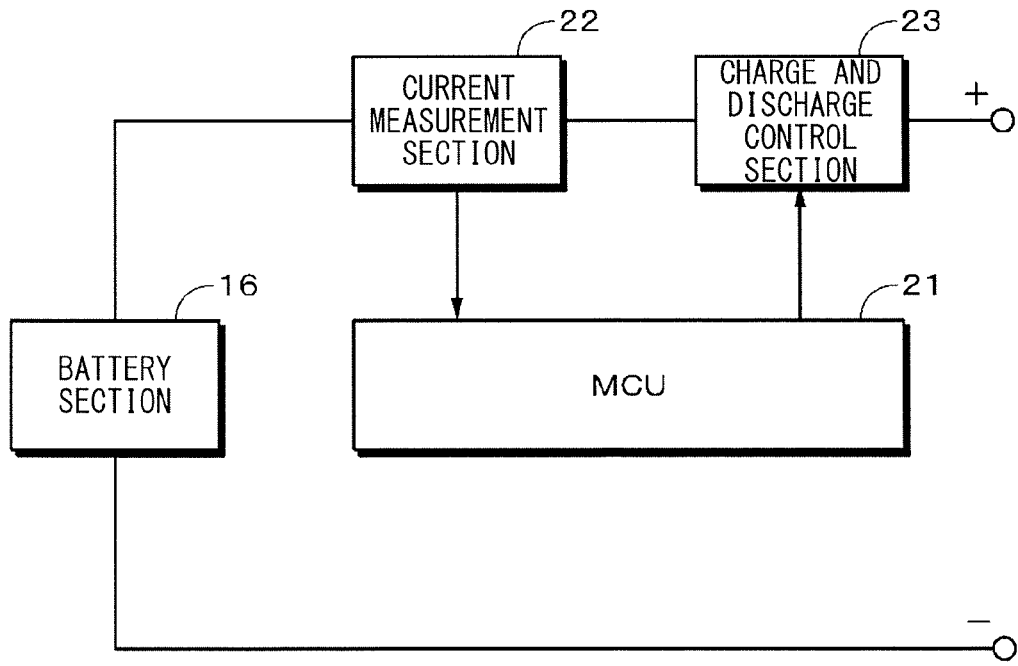
FIG. 5 is a block diagram of an example of an actual degradation rate measurement section in the life estimation device according to the embodiment of the present disclosure.

Schematically, the degradation rate measurement section 15 is configured as illustrated in FIG. 5. A current measurement section 22 and a charge and discharge control section 23 are inserted in a current path of the battery section 16. A current (a charge current or a discharge current) measured by the current measurement section 22 is supplied to a microcontroller unit 21. The microcontroller unit 21 generates a control signal to control the charge and discharge control section 23.

Data of initial capacity Capa (0) is stored in a nonvolatile memory in the microcontroller unit 21. For example, a discharge current in the case where the battery section 16 is charged until a full-charged state and full discharge is performed from the full-charged state is integrated by the microcontroller unit 21. Thereby, a capacity Capa (x) X days after the initial charge is obtained. Further, the actual degradation rate R % is obtained by the following expression.

$R=100-100 \times Capa(x)/Capa(0)$ where $0 \le R \le 100$ holds.

(capacity retention rate)=100−(capacity degradation rate) holds.

In the foregoing method of measuring an actual degradation rate, a capacity from a full-charged state (SOC=100%) to a full-discharge state (SOC=0%) is measured. By comparing such a capacity at the time of use of a battery to a battery capacity before starting use of the battery, a degradation state is obtainable.

However, performing the foregoing measurement at the same time as actual use of a battery to obtain a full-discharged state of the battery may corresponds to, for example, a state that a vehicle loses running capacity in the case where the battery is used for the vehicle, or a state that backup ability is lost in the case where the battery is used for a backup electric power source. Such states are not allowable. Therefore, in the case where an apparatus is in use, a degradation rate may be estimated by a method already known as a method of measuring an actual degradation rate. For example, a degradation rate of a battery may be estimated from variation in internal resistance of the battery, voltage drop of the battery, and/or the like.

EXAMPLES

A description will be given in detail of specific examples of the embodiment of the present disclosure. However, examples thereof are not limited thereto.

Example 1

A coin-type secondary battery having a capacity of 5 mAh was fabricated with the use of graphite as an anode active material and $LiFePO_4$ as a cathode active material. After sealing thereof, charge was performed by a constant current and constant voltage method for 7.5 hours at 3.6 V, at 1 mA, and at room temperature, and subsequently, discharge was performed at 1 mA until the voltage reached 2.0 V at room temperature. Again, charge was performed for 2.5 hours at a constant voltage of 3.6 V and at a constant current of 2.5 mA, and subsequently, discharge was performed at a current of 2.5 mA until the voltage reached 2.0 V. An obtained discharge capacity of 5.0 mAh was regarded as the initial capacity. Next, as illustrated in Table 1, charge and discharge and preservation with time were performed.

TABLE 1

| | Degradation estimation conditions | | | | | | |
|---|---|---|---|---|---|---|---|
| Stage | 1 | 2 | 3 | 4 | 5 | 6 | 7 |
| Type | Preservation | Capacity measurement | Preservation | Preservation | Preservation | Preservation | Estimated capacity |
| Temperature | 35 deg C. | | 35 deg C. | 45 deg C. | 60 deg C. | 35 deg C. | — |
| SOC | 100 | | 100 | 100 | 100 | 100 | — |
| Time period (days) | 90 | | 60 | 30 | 30 | 30 | — |

TABLE 1-continued

| | Degradation estimation conditions | | | | | | |
|---|---|---|---|---|---|---|---|
| Stage | 1 | 2 | 3 | 4 | 5 | 6 | 7 |
| Measured capacity retention rate | | 91.1% | | | Measured retention rate | | 83.2% |
| | | | | | Estimation of the embodiment of the present invention | | 82.6% |
| | | | | | Comparative example (addition) | | 59.5% |
| | | | | | Comparative example (multiplication) | | 65.5% |

Figure 6:
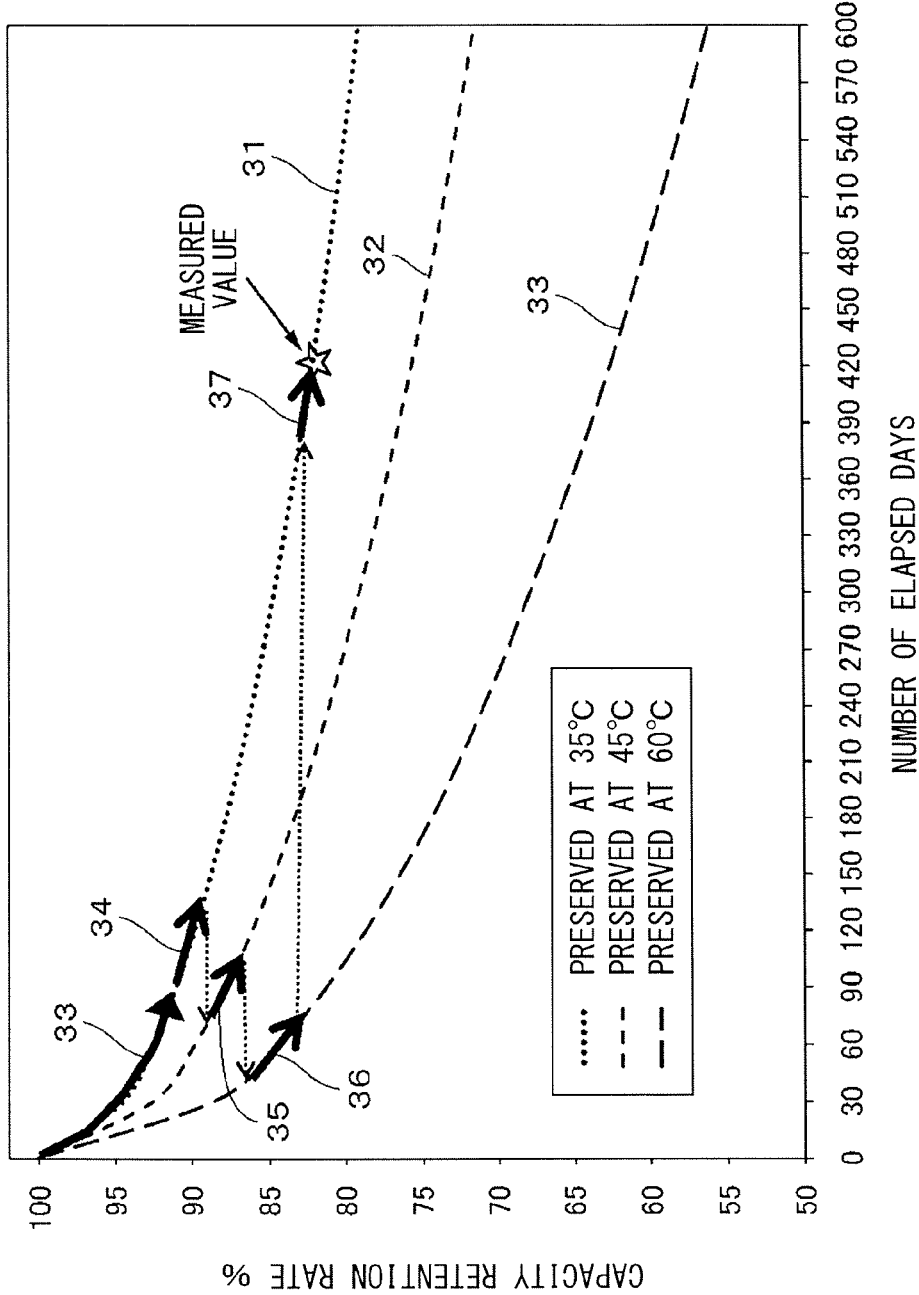
FIG. 6 is a schematic diagram used for explanation of Example 1 according to the embodiment of the present disclosure.

A description will be given of an example of degradation rate variation referring to Table 1 and FIG. 6. FIG. 6 illustrates degradation master curves 31, 32, and 33. The degradation master curve 31 corresponds to the conditions that temperature T is 35 deg C. and SOC is 100%. The degradation master curve 32 corresponds to the conditions that temperature T is 45 deg C. and SOC is 100%. The degradation master curve 33 corresponds to the conditions that temperature T is 60 deg C. and SOC is 100%.

[Stage 1]

After charge was performed for 2.5 hours at a constant voltage of 3.6 V and at a constant current of 2.5 mA at room temperature, the battery was preserved for 90 days at 35 deg C. in a constant temperature bath (a thick line 33 of the degradation master curve 31). After temperature was decreased down to room temperature, discharge was performed at a current of 2.5 mA until the voltage reached 2.0 V.

[Stage 2]

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain capacity retention rate of 91.1%.

[Stage 3]

After charge was performed for 2.5 hours at a constant voltage of 3.6 V and at a constant current of 2.5 mA at room temperature, the battery was preserved for 60 days at 35 deg C. in a constant temperature bath (a thick line 34 of the degradation master curve 31). After temperature was decreased down to room temperature, discharge was performed at a current of 2.5 mA until the voltage reached 2.0 V.

[Stage 4]

After charge was performed for 2.5 hours at a constant voltage of 3.6 V and at a constant current of 2.5 mA at room temperature, the battery was preserved for 30 days at 45 deg C. in a constant temperature bath (a thick line 35 of the degradation master curve 31). After temperature was decreased down to room temperature, discharge was performed at a current of 2.5 mA until the voltage reached 2.0 V.

[Stage 5]

After charge was performed for 2.5 hours at a constant voltage of 3.6 V and at a constant current of 2.5 mA at room temperature, the battery was preserved for 30 days at 60 deg C. in a constant temperature bath (a thick line 36 of the degradation master curve 31). After temperature was decreased down to room temperature, discharge was performed at a current of 2.5 mA until the voltage reached 2.0 V.

[Stage 6]

After charge was performed for 2.5 hours at a constant voltage of 3.6 V and at a constant current of 2.5 mA at room temperature, the battery was preserved for 30 days at 35 deg C. in a constant temperature bath (a thick line 37 of the degradation master curve 31). After temperature was decreased down to room temperature, discharge was performed at a current of 2.5 mA until the voltage reached 2.0 V.

[Stage 7]

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain capacity retention rate of 83.2%.

A description will be given below of a process to obtain a degradation estimation value according to Example 1 of the embodiment of the present disclosure.

The degradation master curves 31, 32, and 33 of the capacity retention rate were calculated by the following expressions (T=absolute temperature).

$$\text{Degradation rate (\%)} = 23000 \times [\exp(-3368/T)] \times [(\text{days})^{\wedge}0.45] \times [\exp(3.247 \times SOC/T)]$$

$$\text{Retention rate (\%)} = 100 - \text{degradation rate (\%)}$$

In the estimation calculation, first, the following values were substituted in the foregoing expression, and thereby, degradation rate of 8.9% was obtained (thick line 33).

$T = 273 + 35$ days=30
SOC=100

Next, the following values were substituted in the foregoing expression, and thereby, degradation rate of 11.2% was obtained (thick line 34).

$T = 273 + 35$ days=90+60
SOC=100

Next, the date when the degradation rate of 11.2% was obtained at 45 deg C. was calculated inversely to obtain days=75.2. The following values were substituted in the foregoing expression, and thereby, degradation rate of 13.2% was obtained (thick line 35).

$T = 273 + 45$ days=75.1+30
SOC=100

Thereafter, the calculation was repeated similarly to obtain the estimation retention rate of 82.6% according to the embodiment of the present disclosure. Such a degradation estimation value is a value close to the measured retention rate of 83.2%.

Comparative Example 1

For a battery fabricated as in Example 1, the initial capacity thereof was measured. Thereafter, charge was performed for 2.5 hours at a constant voltage of 3.6 V and at a constant current of 2.5 mA at room temperature, the battery was subsequently preserved in a constant temperature bath. Thereafter, temperature was decreased down to room temperature, and discharge was performed at a current of 2.5 mA until the voltage reached 2.0 V.

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain capacity retention rate based on single condition.

The temperature and the number of days related to the foregoing preservation were: 35 deg C. and 90 days, 35 deg C. and 60 days, 35 deg C. and 30 days, 45 deg C. and 30 days, and 60 deg C. and 30 days.

Capacity retention rate under single condition was obtained as follows: 35 deg C.

90 days: 91.1%
60 days: 92.6%
30 days: 94.6%

45 deg C.

30 days: 92.6%

60 deg C.

30 days: 88.6%

Retention rate in the case where preservation under a plurality of conditions (35 deg C. and 90 days, 35 deg C. and 60 days, 45 deg C. and 30 days, 60 deg C. and 30 days, and 35 deg C. and 30 days) was continuously made was obtained by multiplication. As a result, complex retention rate became 65.5% as shown in the following expression:

0.911×0.926×0.926×0.886×0.946=0.655

On the other hand, in the case where complex degradation rate was obtained by addition, the result became 40.5% as shown in the following expression. Further, retention rate became 59.5% as shown in the following expression.

(1−0.911)+(1−0.926)+(1−0.926)+(1−0.886)+(1−0.946)=0.405

1−0.405=0.595

According to the embodiment of the present disclosure, with respect to the measured retention rate of 83.2%, the estimation value of 82.6% was obtained, which showed significantly favorable correspondence. In the comparative example, the value obtained by multiplication of each retention ratio of respective unit conditions (35 deg C. and 30 days, 35 deg C. and 60 days, 35 deg C. and 90 days, 45 deg C. and 30 days, and 60 deg C. and 30 days) was 65.5%, and the retention rate obtained by addition of each degradation rate was 59.5%. These results were values largely different from the measured values. One reason for this is that, simple multiplication or simple addition of retention rates obtained under respective conditions results in multiple addition of a value in the initial time period with large degradation, leading to excessively large evaluation of degradation. In contrast, in the embodiment of the present disclosure, the multiple addition of initial degradation is avoided, and therefore, favorable estimation is obtained.

Example 2

A coin-type secondary battery was fabricated as in Example 1, and the initial capacity thereof was obtained as in Example 1.

Figure 7:
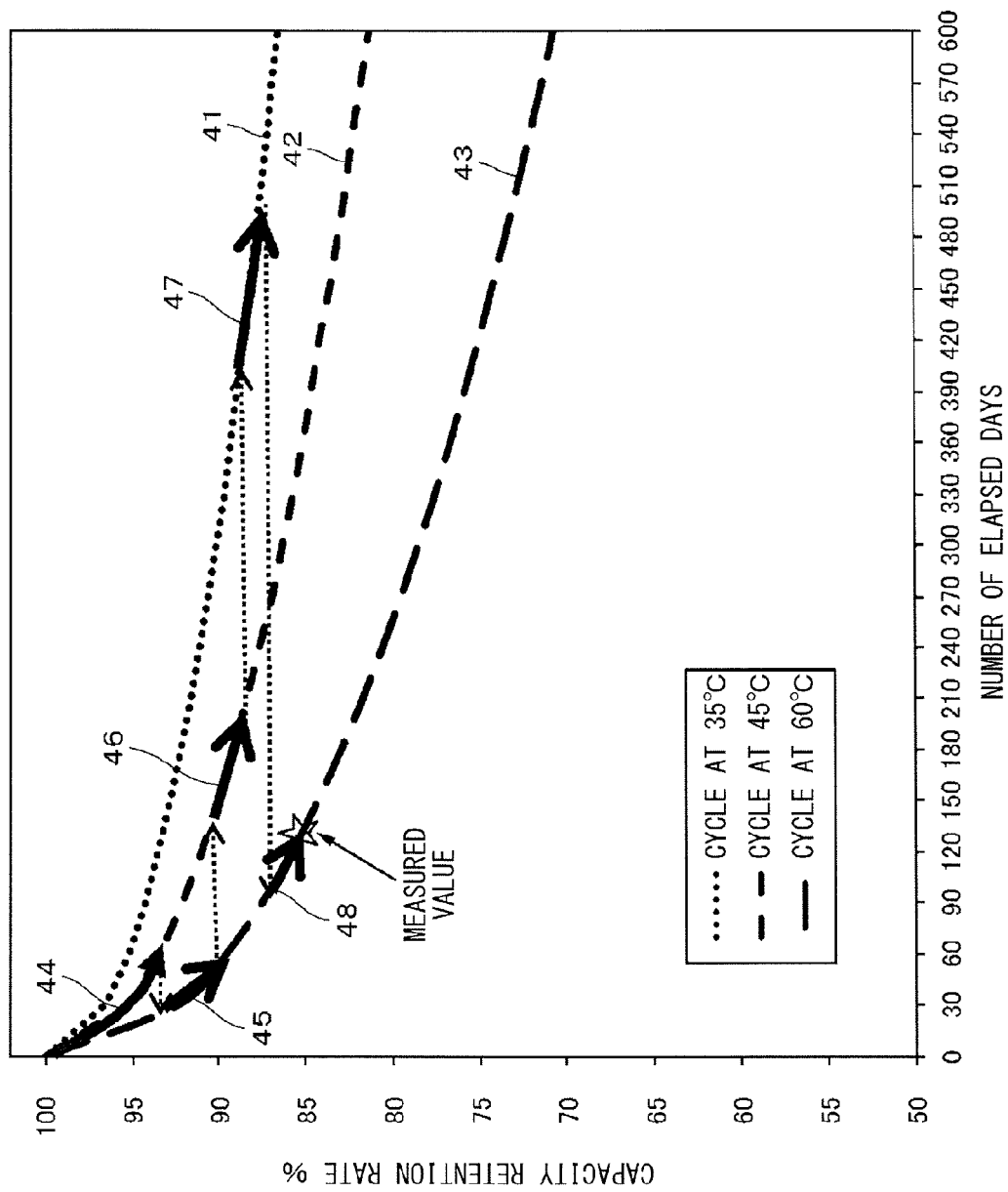
FIG. 7 is a schematic diagram used for explanation of Example 2 according to the embodiment of the present disclosure.

Next, as illustrated in Table 2 and FIG. 7, charge and discharge and cycles with time were performed. FIG. 7 illustrates degradation master curves 41, 42, and 43. The degradation master curve 41 corresponds to conditions that temperature T is 35 deg C. and SOC is 50%. The degradation master curve 42 corresponds to conditions that temperature T is 45 deg C. and SOC is 50%. The degradation master curve 43 corresponds to conditions that temperature T is 60 deg C. and SOC is 50%. Since charge and discharge cycles were performed, SOC was 50% that was half of 100%.

TABLE 2

| | | | Degradation estimation conditions | | | | |
|---|---|---|---|---|---|---|---|
| Stage | 1 | 2 | 3 | 4 | 5 | 6 | 7 |
| Type | Cycle | Capacity measurement | Cycle | Cycle | Cycle | Cycle | Estimated capacity |
| Temperature | 45 deg C. | | 60 deg C. | 45 deg C. | 35 deg C. | 60 deg C. | — |
| SOC | 0-100 | | 0-100 | 0-100 | 0-100 | 0-100 | — |
| Time period (days) | 60 | | 30 | 60 | 90 | 30 | — |
| Measured capacity retention rate | | 93.9% | | | | Measured retention rate | 87.0% |
| | | | | | | Estimation of the embodiment of the present invention | 86.9% |
| | | | | | | Comparative example (addition) | 68.5% |
| | | | | | | Comparative example (multiplication) | 72.2% |

[Stage 1]

A cycle in which discharge was performed at a current of 2.5 mA until the voltage reached 2.0 V after charge was performed for 2.5 hours at a constant voltage of 3.6V and at a constant current of 2.5 mA was repeated for 60 days at 45 deg C. in a constant temperature bath (a thick line 44 of the degradation master curve 42). After temperature was decreased down to room temperature, discharge was performed at a current of 2.5 mA until the voltage reached 2.0 V.

[Stage 2]

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain capacity retention rate of 93.9%.

[Stage 3]

A cycle in which discharge was performed at a current of 2.5 mA until the voltage reached 2.0 V after charge was performed for 2.5 hours at a constant voltage of 3.6 V and at a constant current of 2.5 mA) was repeated for 30 days at 60 deg C. in a constant temperature bath (a thick line 45 of the degradation master curve 43).

[Stage 4]

A cycle in which discharge was performed at a current of 2.5 mA until the voltage reached 2.0 V after charge was performed for 2.5 hours at a constant voltage of 3.6 V and at a constant current of 2.5 mA was repeated for 60 days at 45 deg C. in a constant temperature bath (a thick line 46 of the degradation master curve 42).

[Stage 5]

A cycle in which discharge was performed at a current of 2.5 mA until the voltage reached 2.0 V after charge was performed for 2.5 hours at a constant voltage of 3.6 V and at a constant current of 2.5 mA was repeated for 90 days at 35 deg C. in a constant temperature bath (a thick line 47 of the degradation master curve 41).

[Stage 6]

A cycle in which discharge was performed at a current of 2.5 mA until the voltage reached 2.0 V after charge was performed for 2.5 hours at a constant voltage of 3.6V and at a constant current of 2.5 mA was repeated for 30 days at 60 deg C. in a constant temperature bath (a thick line 48 of the degradation master curve 43).

[Stage 7]

After temperature was decreased down to room temperature, discharge was performed at a current of 2.5 mA until the voltage reached 2.0 V.

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain measured retention rate of 87.0%.

A description will be given below of a process to obtain a degradation estimation value according to Example 2 of the embodiment of the present disclosure.

The degradation master curves 41, 42, and 43 of capacity retention rate were calculated by the following expression (T=absolute temperature).

Degradation rate (%)=23000×[exp(−3368/$T$)]×[(days)^0.45]×[exp(3.247×$SOC/T$)]

Retention rate (%)=100−degradation rate (%)

As SOC, an average value of the lowest SOC and the highest SOC of the cycles was used.

In the estimation calculation, first, the following values were substituted in the foregoing expression, and thereby, degradation rate of 6.1% was obtained (the thick line 44).

$T$=273+45 days=60

SOC=50

Next, the date when the degradation rate of 6.1% was obtained at 60 deg C. was calculated inversely to obtain days=22. The following values were substituted in the foregoing expression, and thereby, degradation rate of 9.0% was obtained (thick line 45).

$T$=273+60 days=22+30

SOC=50

Thereafter, the calculation was repeated similarly to obtain the estimation retention rate of 86.9% according to the embodiment of the present disclosure. Such a degradation estimation value is a value close to the measured retention rate of 87%.

Comparative Example 2

For a battery fabricated as in Example 2, the initial capacity thereof was measured. Thereafter, charge was performed for 2.5 hours at a constant voltage of 3.6 V and at a constant current of 2.5 mA at room temperature, and the battery was subsequently preserved in a constant temperature bath. Thereafter, temperature was decreased down to room temperature, and discharge was performed at a current of 2.5 mA until the voltage reached 2.0 V.

Subsequently, charge was performed for 2.5 hours at a constant voltage of 3.6 V and at a constant current of 2.5 mA. Subsequently, discharge was performed at a current of 2.5 mA until the voltage reached 2.0 V. An obtained discharge capacity value was divided by the initial capacity value (5.0 mAh) to obtain capacity retention rate under single condition.

The temperature and the number of days related to the foregoing cycles were: 45 deg C. and 60 days, 60 deg C. and 30 days, and 35 deg C. and 90 days.

Capacity retention rate under each single condition was obtained as follows:

45 deg C. and 60 days: 93.9%

60 deg C. and 30 days: 93.0%

35 deg C. and 90 days: 94.7%

Retention rate in the case where cycles under a plurality of conditions (45 deg C. and 60 days, 60 deg C. and 30 days, 45 deg C. and 60 days, 35 deg C. and 90 days, and 60 deg C. and 30 days) were continuously made was obtained by multiplication. As a result, complex retention rate became 72.2% as shown in the following expression:

0.939×0.930×0.939×0.947×0.930=0.722

On the other hand, in the case where complex degradation rate was obtained by addition, the result became 31.5% as shown in the following expression. Further, retention rate became 68.5% as shown in the following expression.

(1−0.939)+(1−0.930)+(1−0.939)+(1−0.947)+(1−0.930)=0.315

1−0.315=0.685

According to the embodiment of the present disclosure, with respect to the measured retention rate of 87.0%, the estimation value of 86.9% was obtained, which showed significantly favorable correspondence. In the comparative example, the value obtained by multiplication of the respective retention rates of the respective unit conditions was 72.2%, and the retention rate obtained by addition of respective degradation rates was 68.5%. These results were values largely different from the measured values. One reason for this is that simple multiplication or simple addition of results under respective conditions results in multiple addition of a value in time period with large initial degradation, leading to excessively large evaluation of degradation. In contrast, in the embodiment of the present disclosure, the multiple addition of initial degradation is avoided, and therefore, favorable estimation is obtained.

[Electric Power Storage System in Residence as Application Example]

Figure 8:
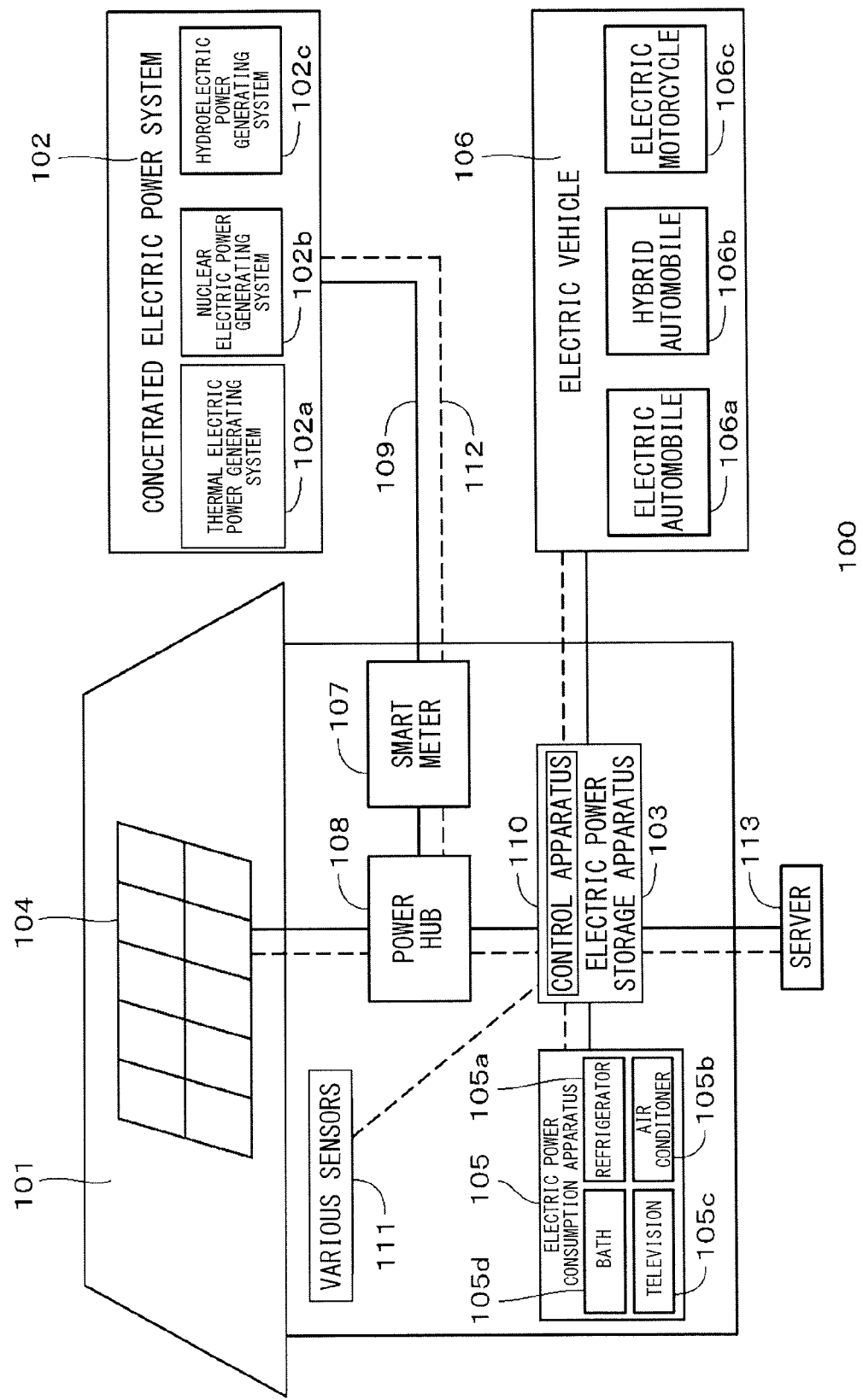
FIG. 8 is a block diagram of a first example of application examples to which an electric power source device according to an embodiment of the present disclosure is applicable.

A description will be given of an example in which the embodiment of the present disclosure is applied to an electric power storage system for a residence referring to FIG. 8. For example, in an electric power storage system 100 for a residence 101, electric power is supplied from a concentrated electric power system 102 such as a thermal electric power generating system 102a, a nuclear electric power generating system 102b, and a hydroelectric power generating system 102c to an electric power storage apparatus 103 through an electric power network 109, an information network 112, a smart meter 107, a power hub 108, and/or the like. In addition thereto, electric power is supplied from an independent electric power source such as a domestic power generating apparatus 104 to the electric power storage apparatus 103. The electric power supplied to the electric power storage apparatus 103 is stored. With the use of the electric power storage apparatus 103, electric power used in the residence 101 is supplied to the residence. A similar electric power storage system may be used not only in the residence 101 but also in other buildings.

The residence 101 is provided with the electric power generating apparatus 104, an electric power consumption apparatus 105, the electric power storage apparatus 103, a control apparatus 110 to control respective apparatuses, the smart meter 107, and a sensor 111 to acquire various information. The respective apparatuses are connected through the electric power network 109 and the information network 112. As the power generating apparatus 104, a solar battery, a fuel battery, and/or the like is used. Generated electric power is supplied to the electric power consumption apparatus 105 and/or the electric power storage apparatus 103. Examples of the electric power consumption apparatus 105 may include a refrigerator 105a, an air-conditioner 105b, a television 105c, and a bath 105d. Further, examples of the electric power consumption apparatus 105 may include an electric vehicle 106. Examples of the electric vehicle 106 may include an electric automobile 106a, a hybrid automobile 106b, and an electric motorcycle 106c.

The electric power storage apparatus 103 is configured of a secondary battery or a capacitor. For example, the electric power storage apparatus 103 may be configured of a lithium ion battery. The lithium ion battery may be a stationary battery, or a battery used in the electric vehicle 106. The foregoing embodiment of the present disclosure is applied to estimation of capacity degradation of the electric power storage apparatus 103. The smart meter 107 has a function to measure a used amount of commercial electric power and to send the measured used amount to an electric power company. The electric power network 109 may be one of direct-current power feeding, alternate current power feeding, and noncontact power feeding, or a combination thereof.

Examples of the various sensors 111 may include a motion sensor, an illuminance sensor, an object sensor, an electric power consumption sensor, a vibration sensor, a contact sensor, a temperature sensor, and an infrared sensor. Information acquired from the various sensors 111 is sent to the control apparatus 110. Due to the information from the sensors 111, a weather state, a human state, and/or the like is perceived, the electric power consumption apparatus 105 is automatically controlled, and energy consumption is allowed to be minimized. Further, the control apparatus 110 is allowed to send information on the residence 101 to an external electric power company and/or the like through the Internet.

The power hub 108 performs a process such as branching of an electric power line and AC/DC conversion. Examples of a communication method of the information network 112 connected to the control apparatus 110 may include a method of using a communication interface such as a UART (Universal Asynchronous Receiver-Transceiver) and a method of utilizing a sensor network based on a wireless communication standard such as Bluetooth (registered trademark), ZigBee, and Wi-Fi. The Bluetooth (registered trademark) method is applied to multimedia communication, and allows one-to-many communication. ZigBee uses IEEE (Institute of Electrical and Electronics Engineers) 802.15.4 physical layer. IEEE 802.15.4 is a name of a short-range wireless network standard called PAN (Personal Area Network) or W (Wireless) PAN.

The control apparatus 110 is connected to an external server 113. The server 113 may be managed by any of the residence 101, an electric power company, and a service provider. Examples of information that is sent from and is received by the server 113 may include consumer electric power information, life pattern information, an electric power fee, weather information, natural disaster information, and information on electric power transaction. Such information may be sent from or received by a domestic electric power consumption device (such as a television), or may be sent from or received by an out-of-home device (such as a mobile phone). Such information may be displayed on a device having a display function such as a television, a mobile phone, and a PDA (Personal Digital Assistants).

The control apparatus 110 that controls respective parts is configured of a CPU (Central Processing Unit), a RAM (Random Access Memory), a ROM (Read Only Memory), and/or the like. In this example, the control apparatus 110 is stored in the electric power storage apparatus 103. The control apparatus 110 is connected to the electric power storage apparatus 103, the domestic power generating apparatus 104, the electric power consumption apparatus 105, the various sensors 111, and the server 113 through the information network 112. For example, the control apparatus 110 may have a function to adjust a used amount of commercial electric power and an electric-power-generating amount. It is to be noted that, in addition thereto, the control apparatus 110 may have a function to perform electric power transaction in the electric power market.

As described above, not only electric power generated by the concentrated electric power system 102 such as the thermal electric power generating system 102a, the nuclear electric power generating system 102b, and the hydroelectric power generating system 102c, but electric power generated by the domestic power generating apparatus 104 (solar power generation or wind power generation) is also allowed to be stored in the electric power storage apparatus 103. Therefore, even if electric power generated by the domestic power generating apparatus 104 is varied, control is allowed to be executed so that an electric power amount sent outside becomes constant, or electric discharge is performed as necessary. For example, electric power obtained by solar power generation may be stored in the electric power storage apparatus 103, while electric power in the middle of the night when an electric power rate is inexpensive may be stored in the electric power storage apparatus 103 and the electric power stored by the electric power storage apparatus 103 may be discharged and utilized during daytime hours when an electric power rate is expensive.

In this example, a description has been given of the example in which the control apparatus 110 is stored in the electric power storage apparatus 103. However, the control apparatus 110 may be stored in the smart meter 107, and may be configured by itself. Further, the electric power storage system 100 may be used for a plurality of households in a housing complex, or may be used for a plurality of single-family houses.

[Electric Power Storage System in Vehicle as Application Example]

Figure 9:
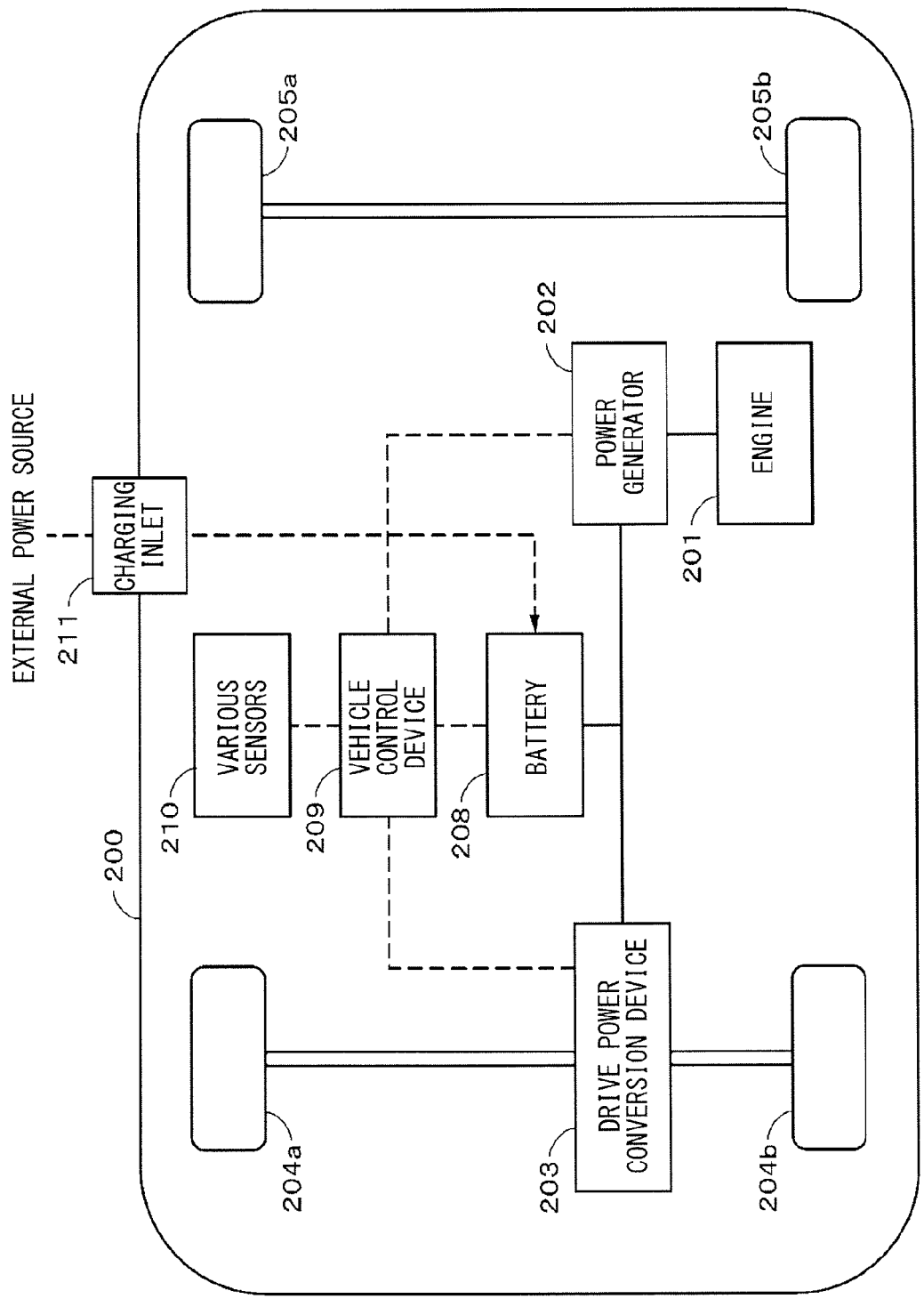
FIG. 9 is a block diagram of a second example of the application examples to which the electric power source device according to the embodiment of the present disclosure is applicable.

A description will be given of an example in which the embodiment of the present disclosure is applied to an electric power storage system for a vehicle referring to FIG. 9. FIG. 9 schematically illustrates an example of a configuration of a hybrid vehicle adopting a series hybrid system to which the embodiment of the present disclosure is applied. The series hybrid system is an automobile running with the use of an electric-power/drive-power conversion device with the use of electric power generated by a power generator moved by an engine or such electric power that is once stored in a battery.

In a hybrid vehicle 200, an engine 201, a power generator 202, an electric-power/drive-power conversion device 203, a drive wheel 204a, a drive wheel 204b, a wheel 205a, a wheel 205b, a battery 208, a vehicle control device 209, various sensors 210, and a charge inlet 211 are included. The foregoing embodiment of the present disclosure is applied to estimation of capacity degradation of the battery 208.

The hybrid vehicle 200 runs with the use of the electric-power/drive-power conversion device 203 as a power source. Examples of the electric-power/drive-power conversion device 203 may include a motor. The electric-power/drive-power conversion device 203 is operated by electric power of the battery 208, and torque of the electric-power/drive-power conversion device 203 is transferred to the drive wheels 204a and 204b. It is to be noted that, by using direct-current/alternating-current (DC-AC) conversion or reverse conversion (AC-DC conversion) at a necessary point, the electric-power/drive-power conversion device 203 may be used as an alternating current motor or a direct current motor. The various sensors 210 control engine frequency through the vehicle control device 209, controls opening level (throttle opening level) of an unillustrated throttle valve. The various sensors 210 may include a speed sensor, an acceleration sensor, an engine frequency sensor, and/or the like.

Torque of the engine 201 is transferred to the power generator 202. Electric power generated by the power generator 202 due to the torque is allowed to be stored in the battery 208.

When speed of the hybrid vehicle is reduced by an unillustrated brake mechanism, resistance at the time of speed reduction is added to the electric-power/drive-power conversion device 203 as torque, and regenerative electric power generated by the electric-power/drive-power conversion device 203 due to the torque is stored in the battery 208.

The battery 208 may be connected to an external electric power source of the hybrid vehicle, and thereby, may be supplied with electric power from the external electric power source through the charge inlet 211 as an input port, and may store the received electric power.

Although not illustrated, an information processing device to perform information processing of vehicle control based on information on a secondary battery may be included. Example of such an information processing device may include an information processing device to perform display of a remaining battery capacity based on information on the remaining battery capacity.

The description has been given of the series hybrid automobile running with the use of the motor using electric power generated by the electric power generator operated by the engine or such electric power that is once stored in the battery as an example. However, the embodiment of the present disclosure is effectively applicable to a parallel hybrid automobile used by switching three methods of running only by an engine, running only by a motor, and running by the engine and the motor as appropriate with the use of both outputs of the engine and the motor as drive sources. Further, the embodiment of the present disclosure is effectively applicable to a so-called electric vehicle running by drive only by a drive motor without using an engine.

It is possible to achieve at least the following configurations from the above-described example embodiments and the modifications of the disclosure.

(1) A method of estimating a battery life, the method including:

for a secondary battery having a degradation rate R when X days have elapsed after initial charge of the secondary battery, calculating a degradation estimation value (X+Y) days after the initial charge from degradation master data, the degradation master data being identified with use of conditions of temperature T provided for the calculation and a battery state S provided for the calculation; and deriving number of elapsed days Xcorr giving the degradation rate R based on the identified degradation master data, and calculating the degradation estimation value (Xcorr+Y) days after the initial charge from the identified degradation master data.

(2) The method according to (1), wherein the secondary battery includes a cathode active material having an olivine structure.

(3) The method according to (1) or (2), wherein the secondary battery is a lithium ion secondary battery including $LiFePO_4$ as a cathode active material and including graphite as an anode active material.

(4) The method according to (2), wherein the cathode active material having the olivine structure is one of $LiFePO_4$ and $LiMn_xFe_{1-x}PO_4$ where $0<x<1$.

(5) The method according to any one of (1) to (4), wherein the conditions in estimation during the Y days are configured of n-number of conditions Z1, Z2, ..., Zn where $1 \leq n$, and transition from first degradation master data to second degradation master data is performed to allow final degradation rate in the first degradation master data to be start degradation rate in the second degradation master data, the first degradation master data being identified by the condition Zn−1, and the second degradation data being identified by the condition Zn.

(6) The method according to any one of (1) to (5), wherein, as the degradation master data, a value calculated based on a product of a value calculated from temperature of an outer wall of the secondary battery, a value calculated from number of days that have elapsed after the initial charge of the secondary battery, and a value calculated from a battery state of the secondary battery is used.

(7) The method according to (6), wherein the value calculated from the temperature T of the outer wall of the secondary battery is calculated using an expression including exp (−A/T) where T is absolute temperature, the value calculated from the number of days that have elapsed after the initial charge of the secondary battery is calculated using an expression including (the number of days that have elapsed after the initial charge of the secondary battery)^B, and the value calculated from a state of charge SOC of the secondary battery is calculated using an expression including exp (C×SOC/T).

(8) A battery life estimation device including:
   a storage section configured to store a plurality of types of degradation master data;
   a condition setting section configured to set conditions related to temperature T provided for calculation and a battery state S provided for the calculation; and
   a controller configured to obtain a degradation estimation value, wherein
   for a secondary battery having a degradation rate R when X days have elapsed after initial charge of the secondary battery, the battery life estimation device is configured to calculate the degradation estimation value (X+Y) days after the initial charge from the degradation master data,
   the controller is configured to select one of the plurality of types of degradation master data with use of the conditions set by the condition setting section, and
   the controller is configured to derive number of elapsed days Xcorr giving the degradation rate R based on the identified degradation master data, and to calculate the degradation estimation value (Xcorr+Y) days after the initial charge from the identified degradation master data.

(9) An electric vehicle including
   a battery life estimation device including
   a storage section configured to store a plurality of types of degradation master data,
   a condition setting section configured to set conditions related to temperature T provided for calculation and a battery state S provided for the calculation, and
   a controller configured to obtain a degradation estimation value, wherein
   for a secondary battery having a degradation rate R when X days have elapsed after initial charge of the secondary battery, the battery life estimation device is configured to calculate the degradation estimation value (X+Y) days after the initial charge from the degradation master data, the secondary battery being configured to generate drive power of the vehicle,
   the controller is configured to select one of the plurality of types of degradation master data with use of the conditions set by the condition setting section, and
   the controller is configured to derive number of elapsed days Xcorr giving the degradation rate R based on the identified degradation master data, and to calculate the degradation estimation value (Xcorr+Y) days after the initial charge from the identified degradation master data.

(10) An electric power supply apparatus including
   a battery life estimation device including
   a storage section configured to store a plurality of types of degradation master data,
   a condition setting section configured to set conditions related to temperature T provided for calculation and a battery state S provided for the calculation, and
   a controller configured to obtain a degradation estimation value, wherein
   for a secondary battery having a degradation rate R when X days have elapsed after initial charge of the secondary battery, the battery life estimation device is configured to calculate the degradation estimation value (X+Y) days after the initial charge from the degradation master data, the secondary battery being configured to generate alternating electric power,
   the controller is configured to select one of the plurality of types of degradation master data with use of the conditions set by the condition setting section, and
   the controller is configured to derive number of elapsed days Xcorr giving the degradation rate R based on the identified degradation master data, and to calculate the degradation estimation value (Xcorr+Y) days after the initial charge from the identified degradation master data.

[Modification]

Some embodiments of the present disclosure have been specifically described above, which are not limitative. Various modifications based on the technical idea of the present disclosure are possible. For example, the configurations, methods, processes, shapes, materials, numerical values, and the like described above in the embodiments are mere examples, and configurations, methods, processes, shapes, materials, numerical values, and the like different therefrom may be used as necessary.

Moreover, the configurations, methods, processes, shapes, materials, numerical values, and the like described above may be used in combination unless it is out of the gist of the present disclosure.

It should be understood by those skilled in the art that various modifications, combinations, sub-combinations, and alternations may occur depending on design requirements and other factors insofar as they are within the scope of the appended claims or the equivalents thereof.

What is claimed is:

1. A method, comprising:
   in one or more processors:
      calculating a first degradation estimation value "(X+Y)" days after an initial charge from first degradation master data for a battery that has a degradation rate "R" based on "X" days, wherein "X" represent a number of days that have elapsed after the initial charge of the battery,
         wherein the first degradation master data is identified based on a temperature T provided for the calculation and a battery state S provided for the calculation;
      deriving a number of elapsed days "Xcorr" that gives the degradation rate "R" based on second degradation master data,
         wherein "Y" represent a number of days of a battery life estimation period after the "X" days or the "Xcorr" days;
      calculating a second degradation estimation value "(Xcorr+Y)" days after the initial charge from the second degradation master data,
      wherein the first degradation estimation value is different from the second degradation estimation value; and
      determining a battery life based on the first degradation estimation value and the second degradation estimation value.

2. The method according to claim 1, wherein the battery includes a cathode active material having an olivine structure.

3. The method according to claim 1, wherein the battery is a lithium ion battery including $LiFePO_4$ as a cathode active material and graphite as an anode active material.

4. The method according to claim 1, wherein
   conditions in estimation during "Y" days are configured of n-number of conditions $Z_1, Z_2, \ldots, Z_n$ where $1 \le n$, and
   transition from third degradation master data to fourth degradation master data allows a final degradation rate in the third degradation master data to be a start degradation rate in the fourth degradation master data, wherein the third degradation master data is identified by the condition $Z_{n-1}$, and the fourth degradation data is identified by the condition $Z_n$.

5. The method according to claim 1, wherein as the first degradation master data and the second degradation master data, the first degradation estimation value and the second degradation estimation value are calculated based on a product of a value calculated from a temperature of an outer wall of the battery, a value calculated from number of days that have elapsed after the initial charge of the battery, and a value calculated from a state of charge (SOC) of the battery in a first condition or a second condition respectively.

6. The method according to claim 1, wherein the "X" days include one or more days selected from a life range of the battery.

7. The method according to claim 1, wherein the "Xcorr" days refer to one or more days between the "X" days and "Y" days for which the degradation rate "R" remains constant.

8. The method according to claim 2, wherein the cathode active material having the olivine structure is one of LiFePO$_4$ or LiMnxFe$_{1-x}$PO$_4$, wherein x varies between 0 and 1.

9. The method according to claim 5, wherein
the value calculated from the temperature of the outer wall of the battery is calculated based on absolute temperature ("T"),
the value calculated from the number of days that have elapsed after the initial charge of the battery is calculated based on the number of days that have elapsed after the initial charge of the battery and power ("B"), and
the value calculated from the state of charge (SOC) of the battery is calculated based on the state of charge (SOC), the absolute temperature ("T") and a value representative of a dependence of degradation on time ("C").

10. The method according to claim 5, wherein the first degradation master data is determined based on the first condition of temperature and a state of charge (SOC) of the battery existing at $X^{th}$ day of the "X" days.

11. The method according to claim 5, wherein the second degradation master data is determined of based on the second condition of temperature and a state of charge of the battery (SOC) existing for the "Xcorr" days.

12. The method according to claim 9, wherein the power ("B") varies between 0.3 and 0.7.

13. The method according to claim 9, wherein the value representative of the dependence of degradation on time ("C") varies between 0.1 and 1.5.

* * * * *